United States Patent
Nagamatsu

(10) Patent No.: US 10,644,580 B2
(45) Date of Patent: May 5, 2020

(54) POWER SUPPLIES

(71) Applicant: RENESAS ELECTRONICS CORPORATION, Tokyo (JP)

(72) Inventor: Kenichi Nagamatsu, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/433,835

(22) Filed: Jun. 6, 2019

(65) Prior Publication Data

US 2019/0393766 A1  Dec. 26, 2019

(30) Foreign Application Priority Data

Jun. 21, 2018 (JP) .................. 2018-117743

(51) Int. Cl.
| | |
|---|---|
| *H02M 1/14* | (2006.01) |
| *H02M 1/00* | (2006.01) |
| *H02M 3/07* | (2006.01) |
| *H03K 19/21* | (2006.01) |

(52) U.S. Cl.
CPC .............. *H02M 1/00* (2013.01); *H02M 1/14* (2013.01); *H02M 3/07* (2013.01); *H02M 2001/0012* (2013.01); *H02M 2001/0025* (2013.01); *H02M 2001/0041* (2013.01); *H03K 19/21* (2013.01)

(58) Field of Classification Search
CPC .. H02M 1/00; H02M 1/14; H02M 2001/0025; H02M 2001/0012; H02M 2001/0041; H03K 19/21
See application file for complete search history.

(56) References Cited

U.S. PATENT DOCUMENTS

| 7,358,794 B2 | 4/2008 | Kawagoshi | |
| 10,033,268 B2 * | 7/2018 | Pan | ................. H02M 3/07 |

FOREIGN PATENT DOCUMENTS

JP  2005-278383 A  10/2005

\* cited by examiner

*Primary Examiner* — Dinh T Le
(74) *Attorney, Agent, or Firm* — McDermott Will & Emery LLP

(57) ABSTRACT

A power supply circuit capable of generating a stable output voltage is provided. According to one embodiment, the power supply circuit includes a comparison unit that compares the divided voltage corresponding to the external output voltage with each of the first reference voltage and the second reference voltage to output the comparison result, a NAND circuit that controls whether or not to output the clock signal based on the comparison result by the comparison unit, and a booster circuit that boosts the external output voltage when the clock signal is supplied via the NAND circuit.

7 Claims, 13 Drawing Sheets

FIG. 4

|  | Vref [V] | Vref1 [V] | Vref2 [V] | Vout[V] | | | |
|---|---|---|---|---|---|---|---|
|  |  |  |  | Ave | min | max | max-min |
| ONE TYPE OF THE REFERENCE VOLTAGE | 0.80 | | | 7.43 | 6.93 | 7.84 | 0.91 |
| THE TWO TYPES OF REFERENCE VOLTAGES | | 0.79 | 0.81 | 7.47 | 7.16 | 7.75 | 0.59 |
| | | 0.78 | 0.82 | 7.57 | 7.26 | 7.80 | 0.54 |

FIG. 5

| THE STABILIZATION CAPACITANCE [pF] | Vout [V] | | | |
|---|---|---|---|---|
| | Ave | min | max | max-min |
| ONE TYPE OF THE REFERENCE VOLTAGE — 16 | 7.43 | 6.93 | 7.84 | 0.91 |
| THE TWO TYPES OF REFERENCE VOLTAGES — 16 | 7.57 | 7.26 | 7.80 | 0.54 |
| 14 | 7.57 | 7.23 | 7.79 | 0.57 |
| 12 | 7.55 | 7.18 | 7.81 | 0.63 |
| 10 | 7.54 | 7.12 | 7.83 | 0.71 |
| 8 | 7.52 | 7.01 | 7.83 | 0.82 |
| 6 | 7.50 | 6.88 | 7.95 | 1.07 |

POWER SUPPLIES

CROSS-REFERENCE TO RELATED APPLICATIONS

The disclosure of Japanese Patent Application No. 2018-117743 filed on Jun. 21, 2018 including the specification, drawings and abstract is incorporated herein by reference in its entirety.

BACKGROUND

The present invention relates to a power supply circuit and, for example, to a power supply circuit suitable for generating a stable output voltage.

In a semiconductor device, the breakdown voltage of each transistor is lowered with miniaturization of a process. Therefore, a power supply circuit for generating a voltage for driving a semiconductor device is required to generate a stable voltage having a small ripple component (fluctuation range, fluctuation) so that a transistor is not destroyed.

Japanese unexamined Patent Application publication No. 2005-278383 discloses a technique for suppressing a ripple component. The power supply circuit disclosed in Japanese unexamined Patent Application publication No. 2005-278383 includes a charge pump that is driven by a clock signal, a comparator that compares the partial voltage of the output voltage of the charge pump with the reference voltage, and a NAND circuit that controls the availability of a clock signal to the charge pump based on the comparison results of the comparator. Here, in this power supply circuit, the speed of the comparator is controlled so as to be fast from the time when the divided voltage of the output voltage of the charge pump exceeds the reference voltage until the output voltage of the comparator is reversed, and to be slow from the time when the divided voltage of the output voltage of the charge pump falls below the reference voltage until the output voltage of the comparator is reversed. Thus, the power supply circuit can suppress the ripple component of the output voltage of the charge pump when the output current to the load is small.

SUMMARY

However, in the configuration disclosed in Patent Document 1, since the speed of the comparator is controlled to be slow from the time point when the divided voltage of the output voltage of the charge pump becomes lower than the reference voltage until the output voltage of the comparator is reversed, there is a problem that the ripple component of the output voltage of the charge pump becomes larger as the output current to the load becomes larger. Other objects and novel features will become apparent from the description of this specification and the accompanying drawings.

According to one embodiment, the power supply circuit includes: a comparison unit that compares the divided voltage corresponding to the external output voltage with each of the first reference voltage and the second reference voltage to output a comparison result; a first enable circuit that controls whether or not to output a clock signal based on the comparison result by the comparison unit; and a booster circuit that boosts the external output voltage when the clock signal is supplied via the first enable circuit.

According to another embodiment, the power supply circuit includes: a comparator for comparing a divided voltage selected from the first divided voltage and the second divided voltage corresponding to the external output voltage with a reference voltage; a selector for selecting one of the first divided voltage and the second divided voltage based on a comparison result by the comparator and outputting the selected divided voltage as the divided voltage; a first enable circuit for controlling whether or not to output a clock signal based on a comparison result by the comparator; and a booster circuit for boosting the external output voltage when the clock signal is supplied through the first enable circuit.

According to the above embodiment, it is possible to provide a power supply circuit capable of generating a stable output voltage regardless of the magnitude of the output current to the load.

BRIEF DESCRIPTION OF THE DRAWINGS

FIG. 4 is a diagram showing the relation between the set values of the two reference voltage Vref1,Vref2 used for the reference voltage Vref and the output voltage Vout.

FIG. 5 is a diagram showing a relation between a capacitance value of a stabilizing capacitor added to an output terminal OUT and an output voltage Vout;

DETAILED DESCRIPTION

Figure 1:
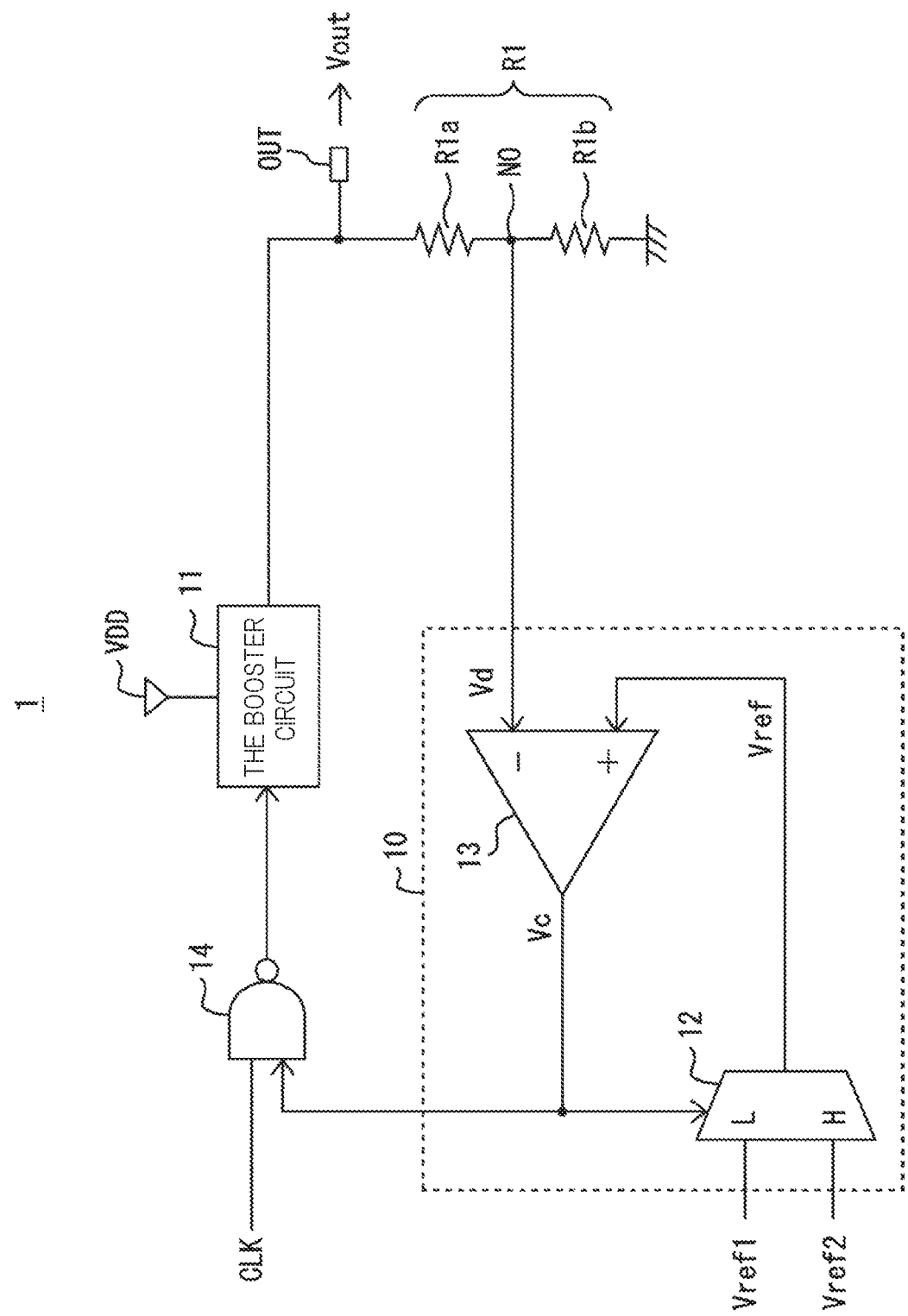
FIG. 1 is a diagram showing a configuration example of a power supply circuit according to a first embodiment.

For clarity of explanation, the following description and drawings are appropriately omitted and simplified. In addition, the respective elements described in the drawings as functional blocks for performing various processes can be realized by a CPU (Central Processing Unit), a memory, and other circuits in terms of hardware, and are realized by programs loaded in the memory in terms of software. Therefore, it is understood by those skilled in the art that these functional blocks can be realized in various forms by hardware alone, software alone, or a combination thereof, and the present invention is not limited to any of them. In the drawings, the same elements are denoted by the same reference numerals, and a repetitive description thereof is omitted as necessary.

Also, the programs described above may be stored and provided to a computer using various types of non-transitory computer readable media. Non-transitory computer readable media includes various types of tangible storage media.

Examples of non-transitory computer-readable media include magnetic recording media (e.g., flexible disks, magnetic tapes, hard disk drives), magneto-optical recording media (e.g., magneto-optical disks), CD-ROM (Read Only Memory), CD-R, CD-R/W, solid-state memories (e.g., masked ROM, PROM (Programmable ROM), EPROM (Erasable PROM, flash ROM, RAM (Random Access Memory)). The program may also be supplied to the computer by various types of transitory computer-readable media. Examples of transitory computer-readable media include electrical signals, optical signals, and electromagnetic waves. The transitory computer readable medium may provide the program to the computer via wired or wireless communication paths, such as electrical wires and optical fibers.

First Embodiment

FIG. 1 is a diagram showing a configuration example of a power supply circuit 1 according to a first embodiment. As shown in FIG. 1, the power supply circuit 1 includes a booster circuit 11, a selector circuit 12, a comparator 13, a negative AND circuit (hereinafter referred to as a NAND circuit) 14, and a resistor R1. The selector 12 and the comparator 13 constitute a comparison unit 10.

The booster circuit 11 is a so-called charge pump which raises the voltage Vout by providing a clock signal CLK. When the clock signal CLK is not supplied, the booster circuit 11 does not boost the voltage Vout. In this instance, the voltage Vout drops. The output voltage Vout of the booster circuit 11 is output to the outside via the output terminal OUT of the power supply circuit 1.

The resistive element R1 is composed of resistive elements R1a and R1b, and is provided in series between the output terminal OUT of the power supply circuit 1 and the ground voltage terminal GND. The resistance element R1 outputs the voltage Vd of the node NO between the resistance elements R1a and R1b. In other words, the resistance element R1 divides the voltage Vout at the output terminal OUT of the power supply circuit 1 by the resistance ratio of the resistance elements R1a and R1b, and outputs the divided voltage Vd.

The selector 12 selects one of the reference voltage Vref1 and the reference voltage Vref2 based on the voltage Vc outputted from the comparator 13, and outputs the selected voltage as the reference voltage Vref. In the present embodiment, the reference voltage Vref1 is larger than the reference voltage Vref2.

For example, when the L-level voltage Vc is outputted from the comparators 13, the selector 12 selects the reference voltage Vref1 and outputs it as the reference voltage Vref. On the other hand, when the H-level voltage Vc is outputted from the comparator 13, the selector 12 selects the standard voltage Vref2 and outputs it as the reference voltage Vref.

Figure 2:
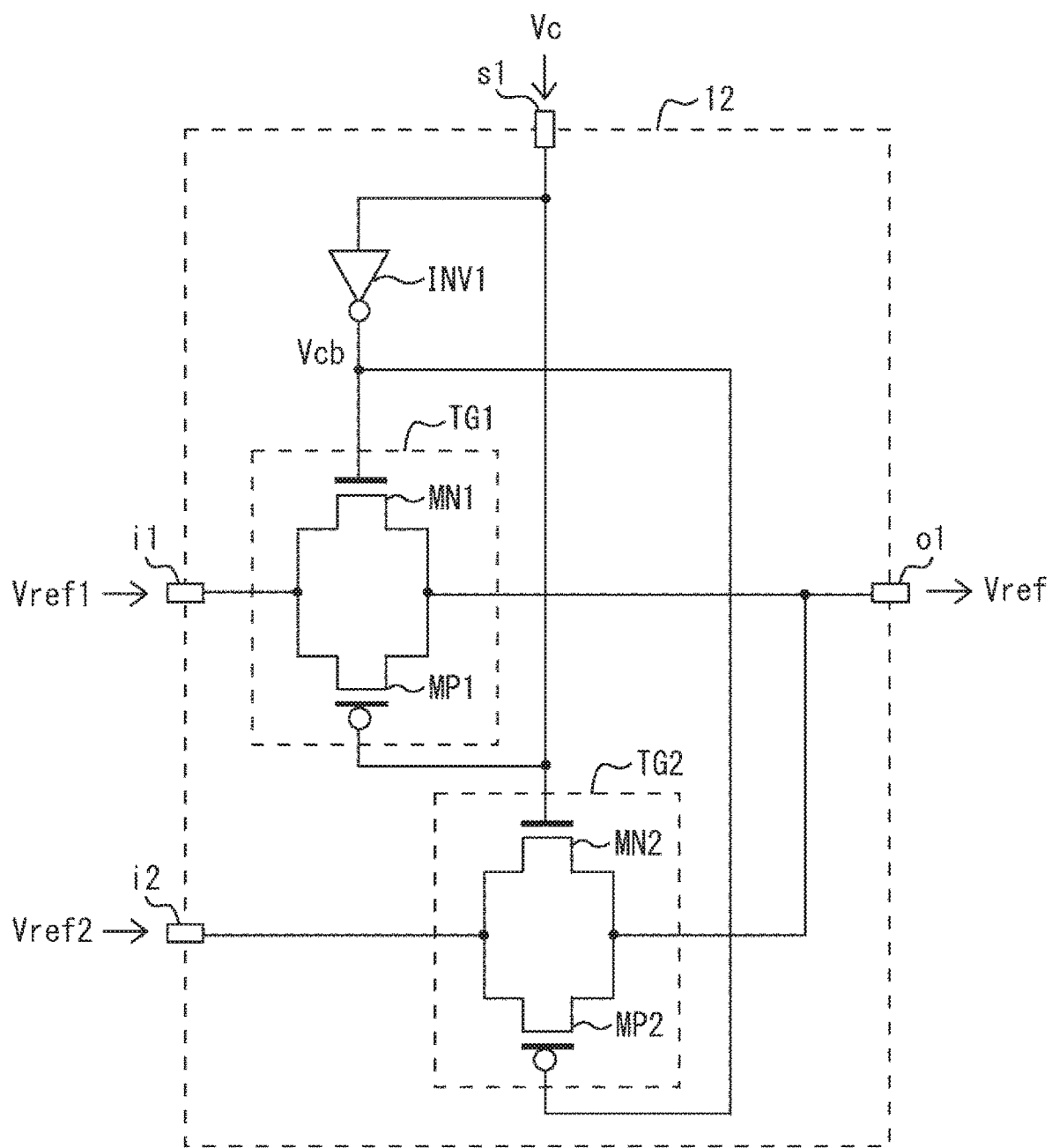
FIG. 2 is a diagram showing a specific configuration example of a selector provided in the power supply circuit shown in FIG. 1.

FIG. 2 is a circuit diagram showing a specific configuration example of the selector 12. As shown in FIG. 2, the selector 12 includes inverters INV1, a transfer gate TG1, and a transfer gate TG 2. The transfer gate TG1 includes a P-channel MOS transistor MP 1 and an N-channel MOS transistor MN 1. The transfer gate TG2 includes a P-channel MOS transistor MP2 and an N-channel MOS transistor MN2.

The transfer gate TG1 is provided between the input terminal i1 of the selector 12 to which the reference voltage Vref1 is externally supplied and the output terminal o1 of the selector 12, and switches on and off based on the voltage Vc supplied from the comparator 13 via the input terminal s1 of the selector 12 and the voltage Vcb obtained by logically inverting the voltage Vc by the inverter INV1. The transfer gate TG1 is provided between the input terminal i2 of the selector 12 to which the reference voltage Vref2 is externally supplied and the output terminal o1 of the selector 12, and switches ON/OFF complementarily to the transfer gate TG1 based on the voltage Vc supplied from the comparator 13 via the input terminal s1 of the selector 12 and the voltage Vcb obtained by logically inverting the voltage Vc by the inverter INV1.

Specifically, in the transfer gate TG1, the transistors MP1 and MN1 are provided in parallel between the input terminal i1 of the selector 12 and the output terminal o1 of the selector 12, and are switched on and off based on the voltages Vc and Vcb supplied to the gates, respectively. In the transfer gate TG2, the transistors MP2 and MN2 are provided in parallel between the input terminal i2 of the selector 12 and the output terminal o1 of the selector 12, and switch on and off complementarily to the transistors MP 1 and MN1 based on the voltages Vcb and Vc supplied to the gates, respectively.

For example, when the L-level voltage Vc is output from the comparator 13, the transfer gate TG1 is turned on and the transfer gate TG2 is turned off. Therefore, the selector 12 outputs the reference voltage Vref1 as the reference voltage Vref from the output terminal o1. On the other hand, when the H-level voltage Vc is output from the comparator 13, the transfer gate TG1 is turned off and the transfer gate TG2 is turned on. Therefore, the selector 12 outputs the reference voltage Vref2 as the reference voltage Vref from the output terminal o1.

The configuration of the selector 12 is not limited to the configuration shown in FIG. 2, and can be appropriately changed to another configuration capable of realizing the same function as the configuration shown in FIG. 2.

Returning to FIG. 1, the description will be continued. The comparator 13 compares the divided voltage Vd with the reference voltage Vref, and outputs a voltage Vc as a result of the comparison. Ideally, the comparator 13 outputs the L-level voltage Vc when the voltage Vd is equal to or higher than the reference voltage Vref, and outputs the H-level voltage Vc when the voltage Vd is less than the reference voltage Vref.

The NAND circuit 14 is a so-called enable circuit, and controls whether to output the clock signal CLK to the booster circuit 11 based on the output voltage Vc of the comparator 13. For example, when an L-level signal is output from the comparator 13, the NAND circuit 14 outputs an H-level signal regardless of the clock signal CLK. That is, the NAND circuit 14 stops supplying the clock signal CLK to the booster circuit 11. As a result, the booster 11 does not boost the output voltage Vout. On the other hand, when the H-level signal is outputted from the comparator 13, the NAND circuit 14 supplies the clock signal CLK (strictly speaking, an inverted signal of the clock signal CLK in this embodiment) to the booster circuit 11. In this case, the booster 11 boosts the output voltage Vout. The NAND circuit 14 can be appropriately replaced to other circuits, such as an AND circuit, which can control whether the clock signal CLK is supplied to the booster circuit 11 based on the output voltage Vc of the comparator 13.

Figure 3:
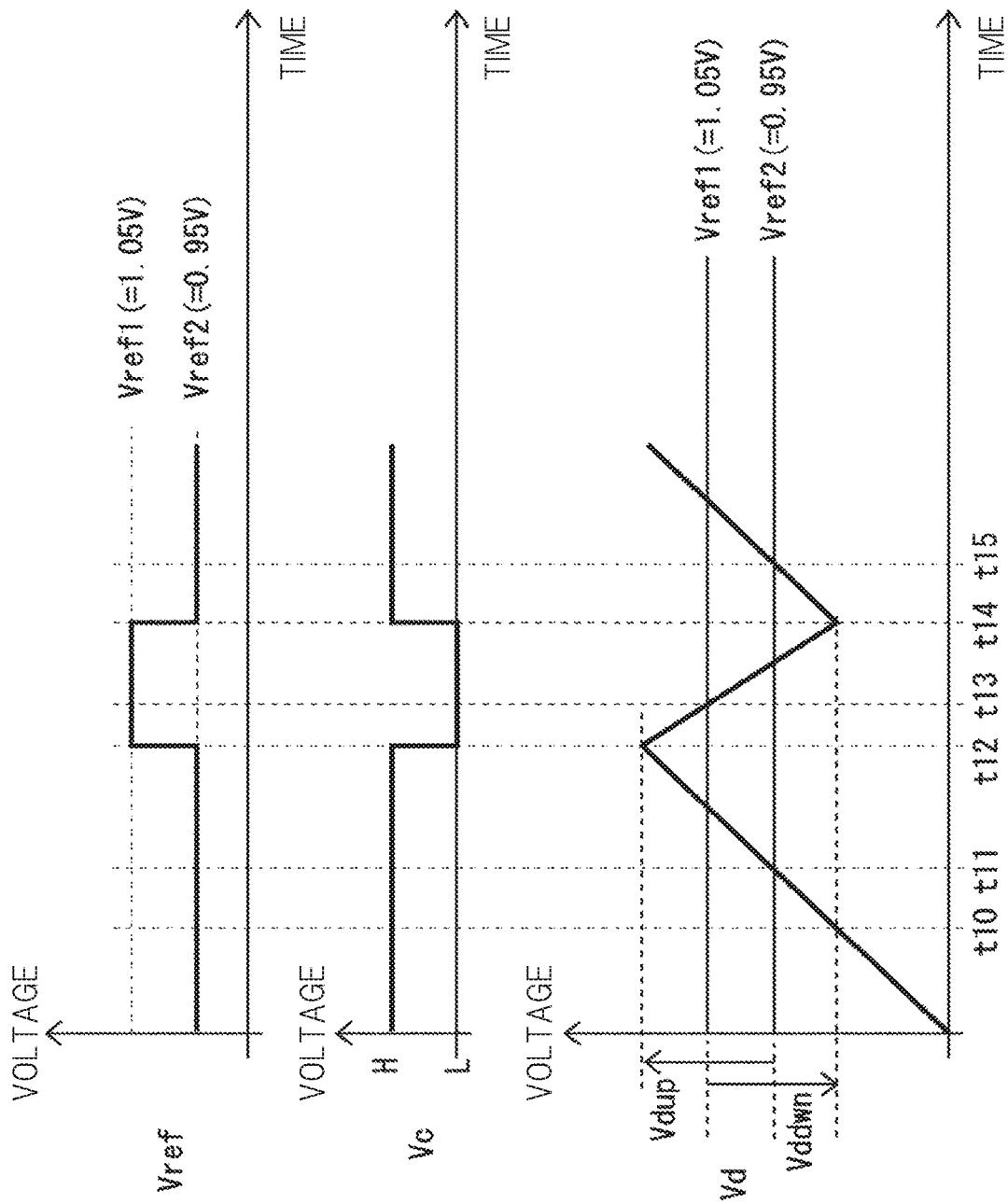
FIG. 3 is a timing chart illustrating the operation of the power supply circuit shown in FIG. 1.

Next, the operation of the power supply circuit 1 will be described with reference to FIG. 3. FIG. 3 is a timing chart showing the operation of the power supply circuit 1. In the following explanation, it is assumed that the power supply voltage VDD for driving the booster circuit 11 is 2 V, the target voltage of the output voltage Vout of the booster circuit 11 is 10 V, the resistance ratio R1a:R1b of the resistance elements R1a and R1b is 9:1, the reference voltage Vref1 is 1.05 V, and the reference voltage Vref2 is 0.95 V.

As shown in FIG. 3, immediately after the boosting of the output voltage Vout by the booster 11 is started, the output voltage Vout is equal to or higher than the power supply voltage VDD (=2V) and equal to or lower than the target voltage (=10V) (time t10). For example, if the output voltage Vout is 5V, the partial voltage Vd of the output voltage Vout is 0.5V. In this case, the divided voltage Vd becomes smaller than the reference voltage Vref regardless of which of the reference voltages Vref1,Vref2 is selected as the reference voltage Vref by the selector 12. Therefore, the comparator 13 outputs the H-level voltage Vc.

When the H-level voltage Vc is outputted from the comparator 13, the selector 12 selects the reference voltage Vref2 (=0.95 V) and outputs the selected reference voltage as the reference voltage Vref. The NAND circuit 14 supplies the clock signal CLK to the booster circuit 11. As a result, the booster 11 continues to boost the output voltage Vout.

When the output voltage Vout rises, the divided voltage Vd of the output voltage Vout also rises accordingly. Therefore, after a while, the partial voltage Vd reaches the reference voltage Vref (=0.95V) (time t11). However, the comparator 13 maintains the output voltage Vc at the H level under the influence of the offset voltage of the comparator 13, the response speed of the comparator 13, the boost speed of the output voltage Vout determined by the booster 11, and the like.

Thereafter, when the output voltage Vout further rises and the divided voltage Vd accordingly rises, the comparator 13 switches the output voltage Vc from the H level to the L level at time t12. For example, when the output voltage Vout exceeds the target voltage (=10 V) and becomes 11 V, the divided voltage Vd of the output voltage Vout becomes 1.1 V. Furthermore, since the partial voltage Vd is larger than the reference voltage Vref (=1.05V), the comparator 13 outputs a voltage Vc at the L-level.

Therefore, the selector 12 selects the reference voltage Vref1 (=1.05V) from the reference voltage Vref2 and outputs the reference voltage Vref. Furthermore, the NAND circuit 14 stops supplying the clock signal CLK to the booster circuit 11. As a result, the booster circuit 11 stops boosting the output voltage Vout. As a result, the output voltage Vout starts to drop. When the output voltage Vout drops, the divided voltage Vd of the output voltage Vout also drops accordingly. Therefore, after a while, the partial voltage Vd reaches the reference voltage Vref (=1.05V) (time t13). However, the comparator 13 maintains the output voltage Vc at the L level under the influence of the offset voltage of the comparator 13, the reaction speed of the comparator 13, the falling speed of the output voltage Vout determined by the output current loads of the booster 11, and the like.

Thereafter, when the output voltage Vout further drops and the divided voltage Vd drops accordingly, the comparator 13 switches the output voltage Vc from the L level to the H level at time t14. As a result, the selector 12 switches the selection from the reference voltage Vref1 to the reference voltage Vref2 (=0.95 V) and outputs the reference voltage Vref. Furthermore, the NAND circuit 14 restarts supplying the clock signal CLK to the booster circuit 11. As a result, the booster circuit 11 restarts the boosting of the output voltage Vout.

Thereafter, after time t15, the operations from time t11 to t15 are repeated.

Here, the ripple rising component of the booster circuit 11 has a positive value proportional to the rising component Vdup of the divided voltage Vd rising from the time t11 to the time t12. The ripple lowering component of the booster circuit 11 shows a negative value proportional to the lowering Vddwn of the partial voltage Vd lowered from time t13 to time t14. Therefore, the ripple component of the booster 11 has a value proportional to the sum of the ripple rising component and the ripple falling component, that is, the value proportional to the sum of the voltage Vdup and the voltage Vddwn. However, the voltage Vdup and the voltage Vddwn overlap by the potential difference between the reference voltages Vref1,Vref2. Therefore, the ripple components of the booster circuit 11 are suppressed by a fraction of the value proportional to the potential difference between the reference voltage Vref1,Vref2.

As described above, the power supply circuit 1 according to the present embodiment controls whether or not the output voltage Vout can be boosted by the booster circuit 11 based on the result of comparing the divided voltage Vd of the output voltage Vout with one of the reference voltages Vref1,Vref2 selectively used. As a result, the power supply circuit 1 according to the present embodiment can partially overlap the ripple rising component and the ripple falling component of the booster circuit 11, so that the overall ripple component of the booster circuit 11 can be suppressed. In other words, the power supply circuit 1 according to the present embodiment can generate a stable output voltage Vout regardless of the magnitude of the output current to the loads.

For example, in the case where the voltage used for the reference voltage Vref is one type, as shown in Patent Document 1, there is no overlap between the ripple elevation component and the ripple lowering component of the boosting circuit 11, so it is impossible to suppress the overall ripple component of the boosting circuit 11.

FIG. 4 is a diagram showing the relation between the set values of the two types of reference voltages Vref1,Vref2 used for the reference voltage Vref and the output voltage Vout in the power supply circuit 1 according to the present embodiment. FIG. 4 also shows the output voltage Vout when one type of voltage is used for the reference voltage Vref for comparison.

In FIG. 4, when one type of voltage is used for the reference voltage Vref, the reference voltage Vref is assumed to be 0.80 V. When two types of voltages used for the reference voltage Vref are the reference voltage Vref1, Vref2, the mean voltage of the reference voltages Vref1, Vref2 is assumed to be 0.80 V.

Referring to FIG. 4, when one type of voltage is used for the reference voltage Vref, the minimum value of the output voltage Vout is 6.93 V, the maximum value is 7.84 V, the mean value is 7.43 V, and the difference between the maximum value and the minimum value (i.e., ripple components) is 0.91 V.

On the other hand, when two kinds of voltages used for the reference voltage Vref are the reference voltage Vref1 of 0.79 V and the reference voltage Vref2 of 0.82 V, the minimum value of the output voltage Vout is 7.16 V, the maximum value is 7.75 V, the mean value is 7.47 V, and the difference between the maximum value and the minimum value (i.e., ripple components) is 0.59 V. In this case, the ripple components are suppressed by about 35% as compared with the case where one type of voltage is used for the reference voltage Vref.

When two kinds of voltages used for the reference voltage Vref are the reference voltage Vref1 of 0.78 V and the reference voltage Vref2 of 0.82 V, the minimum value of the output voltage Vout is 7.26 V, the maximum value is 7.80 V, the mean value is 7.57 V, and the difference between the maximum value and the minimum value (i.e., the ripple component) is 0.54 V. In this case, the ripple components are suppressed by about 41% as compared with the case where one type of voltage is used for the reference voltage Vref.

FIG. 5 is a diagram showing the relation between the capacitance value of the stabilizing capacitor added to the output terminal OUT and the output voltage Vout in the power supply circuit according to the present embodiment. FIG. 5 also shows the output voltage Vout when one type of voltage is used for the reference voltage Vref for comparison.

In FIG. 5, when one type of voltage is used for the reference voltage Vref, the reference voltage Vref is assumed to be 0.80 V, and the stabilization capacitance is assumed to be 16 pF. When two types of voltages used for the reference voltage Vref are the reference voltage Vref1, Vref2, the reference voltage Vref1 is assumed to be 0.78 V and the reference voltage Vref2 is assumed to be 0.82 V.

Referring to FIG. 5, when one type of voltage is used for the reference voltage Vref and the stabilization capacitance is 16 pF, the minimum value of the output voltage Vout is 6.93 V, the maximum value is 7.84 V, the mean value is 7.43 V, and the difference between the maximum value and the minimum value (i.e., ripple components) is 0.91 V.

On the other hand, when two kinds of voltages are used for the reference voltage Vref and the stabilization capacitance is 16 pF, the minimum value of the output voltage Vout is 7.26 V, the maximum value is 7.80 V, the mean value is 7.57 V, and the difference between the maximum value and the minimum value (i.e., ripple components) is 0.54 V. In this case, as described above, the ripple components are suppressed by about 41% as compared with the case where one type of voltage is used for the reference voltage Vref.

Here, if the stabilization capacity value is reduced to 8 pF, the minimum value of the output voltage Vout is 7.01V, the maximum value is 7.83V, the mean value is 7.52V, and the difference between the maximum value and the minimum value (i.e., ripple component) is 0.82V. Further, when the capacitance value of the stabilizing capacitance is reduced to 6 pF, the minimum value of the output voltage Vout is 6.88 V, the maximum value is 7.95 V, the mean value is 7.50 V, and the difference between the maximum value and the minimum value (i.e., the ripple component) is 1.07 V. Therefore, when the capacitance of the stabilizing capacitor is about 7 pF, the ripple component of the output voltage Vout is considered to be about 0.9 V.

That is, in the case where two kinds of voltages are used for the reference voltage Vref, even if the capacitance value of the stabilization capacitor is reduced to about 7 pF, the ripple component can be suppressed to the same level as in the case where one kind of voltage is used for the reference voltage Vref and in the case where the stabilization capacitor is 16 pF. In other words, the power supply circuit 11 according to the present embodiment can suppress equivalent ripple components with a smaller circuit size as compared with the case where the voltage used for the reference voltage Vref is one type.

Figure 6:
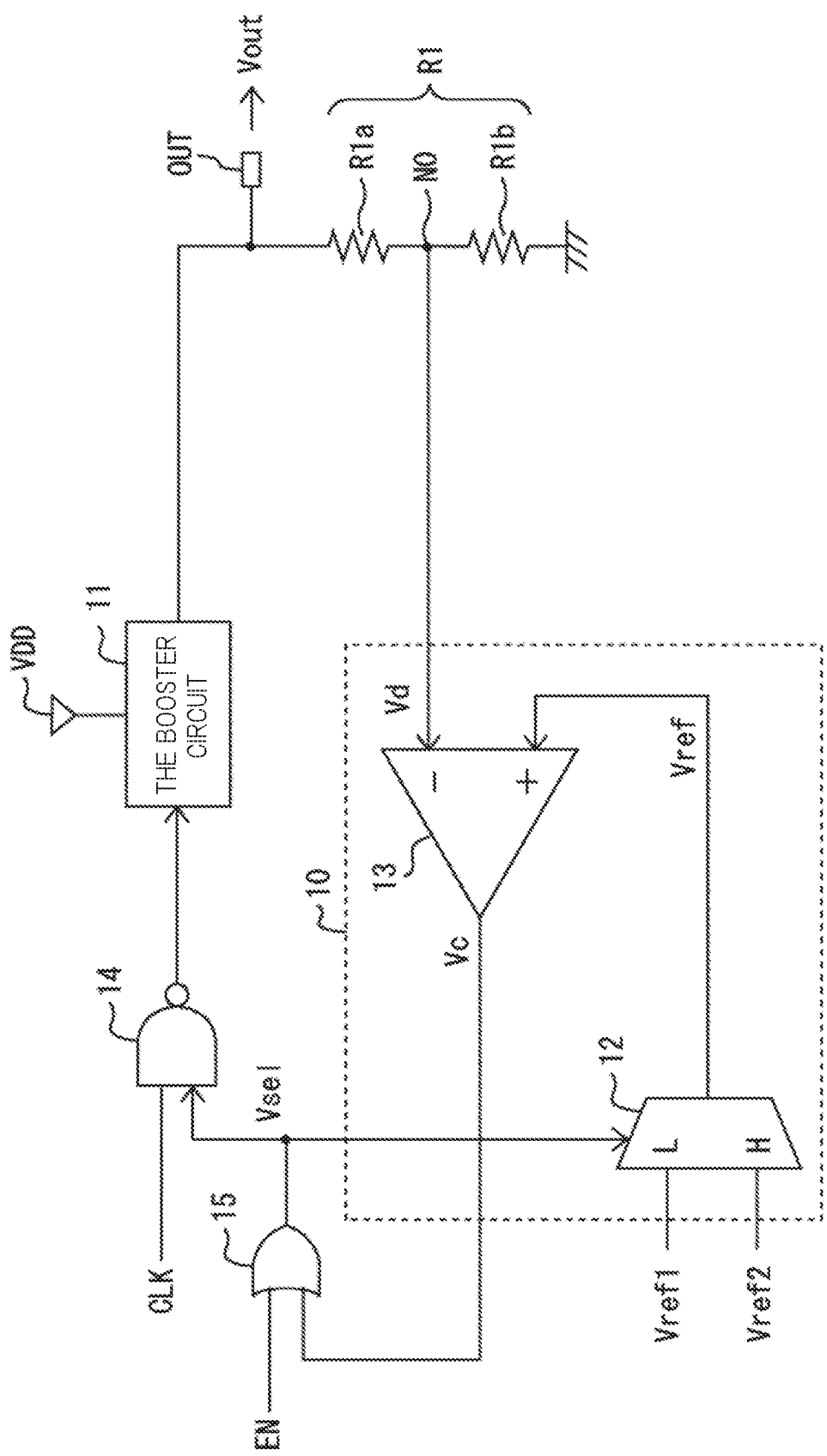
FIG. 6 is a diagram illustrating a modification of a power supply circuit according to the first embodiment.

FIG. 6 is a diagram showing a modification of the power supply circuit 1 as a power supply circuit 1a. The power supply circuit 1 a further includes an OR circuit 15 as compared with the power supply circuit 1.

The OR circuit 15 is a so-called enable circuit, and outputs a logical sum of the enable signal EN supplied from the outside and the voltage Vc outputted from the comparator 13 as a voltage Vsel. The enable signal EN may be shared with, for example, an enable signal used for controlling whether or not the booster circuit 11 or its peripheral circuits can operate.

The OR circuit 15 outputs a voltage Vsel at the H level regardless of the output voltage Vc of the comparator 13 when the enable signal EN is at the H level, and outputs the output voltage Vc of the comparator 13 as a voltage Vsel when the enable signal EN is at the L level. This voltage Vsel is inputted to the selector 12 and the NAND circuit 14 instead of the voltage Vc.

For example, the enable signal EN is set to the H level for a predetermined period immediately after the power supply is started. Thus, even when the output voltage Vc of the comparator 13 is unstable, the voltage Vsel input to the selector 12 and the NAND circuit 14 can be fixed to a stable level (H level). When the output voltage Vc of the comparator 13 is stabilized after a predetermined period of time has elapsed, the enable signal EN is switched from the H level to the L level.

Accordingly, the output voltage Vc of the stable comparator 13 can be input as a voltage Vsel to the selector 12 and the NAND circuit 14.

The OR circuit 15 can be appropriately replaced to other circuits capable of outputting either the output voltage Vc of the comparator 13 or the fixed voltage as the voltage Vsel based on the enable signal EN.

Second Embodiment

Figure 7:
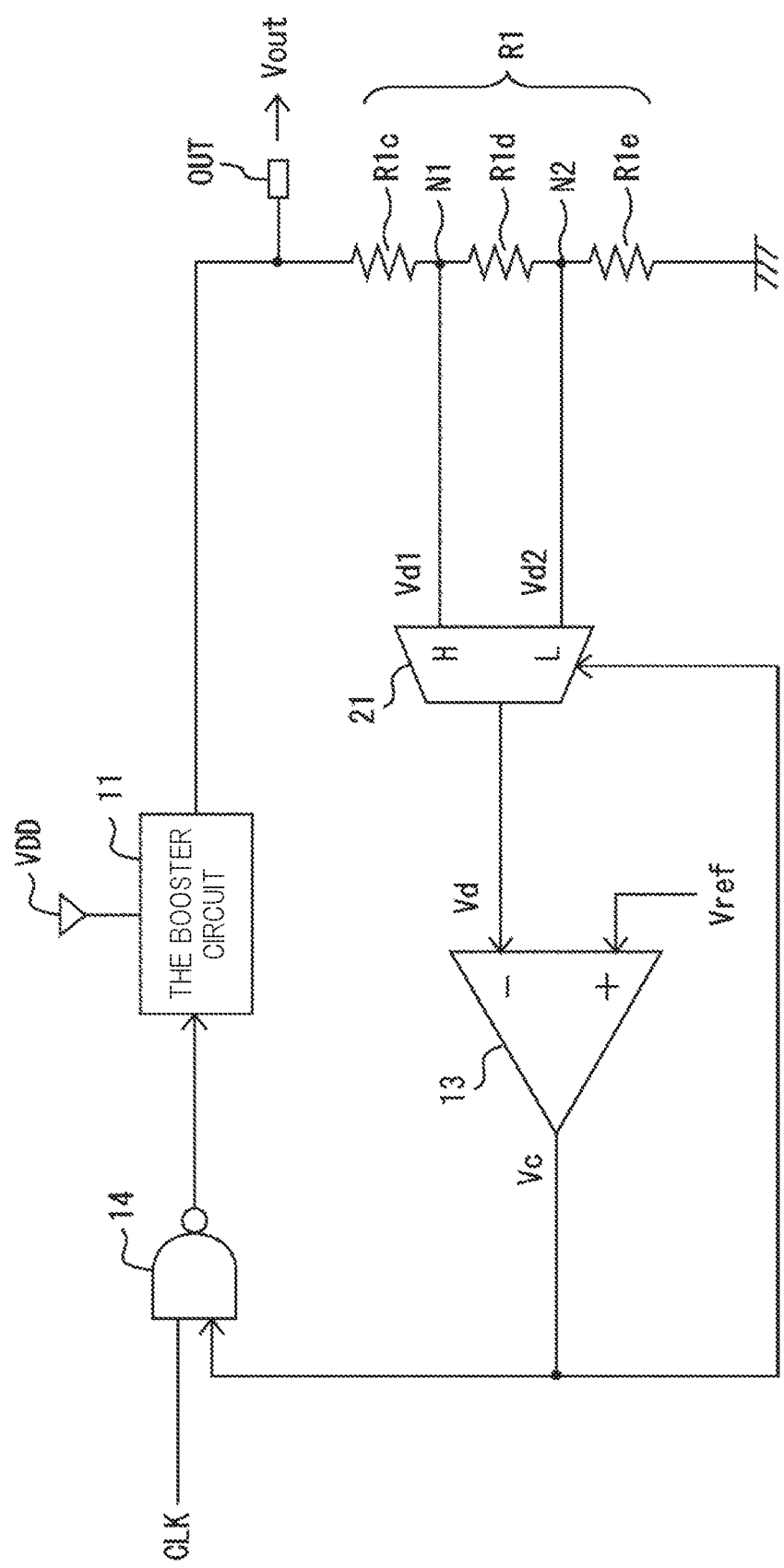
FIG. 7 is a diagram illustrating a configuration example of a power supply circuit according to the second embodiment.

FIG. 7 is a diagram showing a configuration example of the power supply circuit 2 according to the second embodiment. Compared with the power supply circuit 1, the power supply circuit 2 includes a selector 21 instead of the selector 12. Instead of the reference voltage Vref1,Vref2, only the reference voltage Vref is supplied to the power supply circuit 2. Further, the resistive element R1 is configured by resistive elements R1c, R1d, and R1e instead of the resistive elements R1a and R1b. Hereinafter, a concrete description will be given.

As shown in FIG. 7, the power supply circuit 2 includes a booster circuit 11, a selector circuit 21, a comparator 13, a NAND circuit 14, and a resistor R1.

The resistive element R1 is composed of resistive elements R1c, R1d, and R1e, and is provided in series between the output terminal OUT of the power supply circuit 2 and the ground voltage terminal GND. The resistive element R1 outputs the voltage Vd1 of the node N1 between the resistive elements R1c and R1d, and outputs the voltage Vd2 of the node N2 between the resistive elements R1d and R1e. In other words, the resistive element R1 divides the voltage Vout at the output terminal OUT of the power supply circuit 2 by the resistance ratio of the resistive element R1c and the resistive elements R1d and R1e to output as the voltage Vd1, and divides the voltage by the resistance ratio of the resistive elements R1c and R1d and the resistive element R1e to output as the voltage Vd2.

The selector 21 selects one of the divided voltage Vd1 and the divided voltage Vd2 based on the voltage Vc output from the comparator 13, and outputs the selected voltage as the divided voltage Vd. In the present embodiment, a case where the divided voltage Vd1 is larger than the divided voltage Vd2 will be described as an example.

For example, when the L-level voltage Vc is output from the comparator 13, the selector 21 selects the partial voltage Vd2 and outputs the partial voltage Vd. In contrast, when the H-level voltage Vc is output from the comparator 13, the selector selects the partial voltage Vd1 and outputs the partial voltage Vd.

The rest of the configuration of the power supply circuit 2 is the same as that of the power supply circuit 1, and a description thereof will be omitted.

Figure 8:
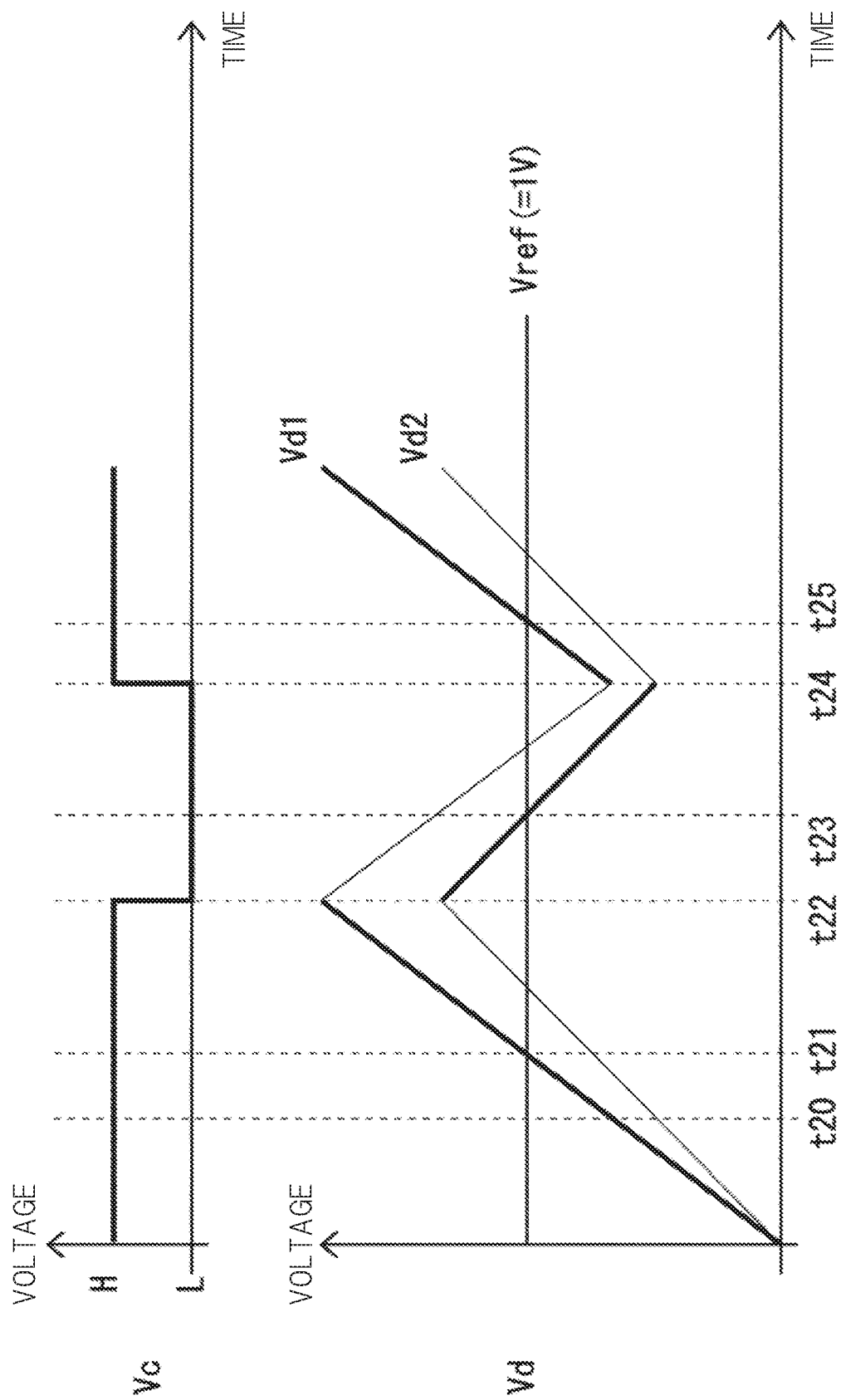
FIG. 8 is a timing chart illustrating operation of the power supply circuit shown in FIG. 7.

Next, the operation of the power supply circuit 2 will be described with reference to FIG. 8. FIG. 8 is a timing chart showing the operation of the power supply circuit 2. In the following explanation, it is assumed that the power supply voltage VDD for driving the booster circuit 11 is 2 V, the target voltage of the output voltage Vout of the booster circuit 11 is 10 V, the resistance ratios R1c, R1d, and R1e of the resistance elements R1c, R1d, and R1e are 8.95:0.1:0.95, and the reference voltage Vref is 1V.

As shown in FIG. 8, immediately after the boosting of the output voltage Vout by the booster 11 is started, the output voltage Vout is equal to or higher than the power supply voltage VDD (=2V) and equal to or lower than the target voltage (=10V) (time t20). For example, if the output voltage Vout is 5V, the partial voltage Vd1 is 0.525V and the partial voltage Vd2 is 0.475V. The reference voltage Vref (=1V) becomes larger than the divided voltage Vd regardless of which of the divided voltages Vd1 and Vd2 is selected as the divided voltage Vd by the selector 21. Therefore, the comparator 13 outputs the H-level voltage Vc.

When the H-level voltage Vc is output from the comparator 13, the selector 21 selects the divided voltage Vd1 (=0.525 V) and outputs it as the divided voltage Vd. In this case, the NAND circuit 14 supplies the clock signal CLK to the booster circuit 11. As a result, the booster 11 continues to boost the output voltage Vout.

When the output voltage Vout rises, the divided voltage Vd of the output voltage Vout (here, Vd=Vd1) also rises. Therefore, after a while, the divided voltage Vd reaches the reference voltage Vref (=1V) (time t21). However, the comparator 13 maintains the output voltage Vc at the H level under the influence of the offset voltage of the comparator 13, the response speed of the comparator 13, the boost speed of the output voltage Vout determined by the booster 11, and the like.

Thereafter, when the output voltage Vout further rises and the divided voltage Vd accordingly rises, the comparator 13 switches the output voltage Vc from the H level to the L level at time t22. For example, when the output voltage Vout exceeds the target voltage (=10V) and becomes 11V, the divided voltage Vd1 becomes 1.155 V and the divided voltage Vd2 becomes 1.045 V. In this case, the partial voltage Vd (=1.155V) is larger than the reference voltage Vref (=1V), so that the comparator 13 outputs the voltage Vc at the L-level.

As a result, the selector 21 switches the selection from the divided voltage Vd1 to the divided voltage Vd2, and outputs the voltage as the divided voltage Vd. Furthermore, the NAND circuit 14 stops supplying the clock signal CLK to the booster circuit 11. As a result, the booster circuit 11 stops boosting the output voltage Vout. As a result, the output voltage Vout starts to drop.

When the output voltage Vout drops, the divided voltage Vd of the output voltage Vout (here, Vd=Vd2) also drops. Therefore, after a while, the divided voltage Vd reaches the reference voltage Vref (=1V) (time t23). However, the comparator 13 maintains the output voltage Vc at the L level under the influence of the offset voltage of the comparator 13, the reaction speed of the comparator 13, the falling speed of the output voltage Vout determined by the output current loads of the booster 11, and the like.

Thereafter, when the output voltage Vout further drops and the divided voltage Vd drops accordingly, the comparator 13 switches the output voltage Vc from the L level to the H level at time t24. As a result, the selector 21 switches the selection from the divided voltage Vd2 to the divided voltage Vd1, and outputs the voltage as the divided voltage Vd. And the NAND circuit 14 restarts supplying the clock signal CLK to the booster circuit 11. As a result, the booster circuit 11 restarts the boosting of the output voltage Vout.

Thereafter, after time t25, the operations from time t21 to t25 are repeated.

As described above, the power supply circuit 2 according to the present embodiment controls whether the booster circuit 11 boosts the output voltage Vout based on the comparison result between the reference voltage Vref and one of the selectively used divided voltages Vd1 and Vd2. As a result, the power supply circuit 2 according to the present embodiment can partially overlap the ripple rising component and the ripple falling component of the booster circuit 11, so that the overall ripple component of the booster circuit 11 can be suppressed. In other words, the power supply circuit 1 according to the present embodiment can generate a stable output voltage Vout regardless of the magnitude of the output current to the loads.

Figure 9:
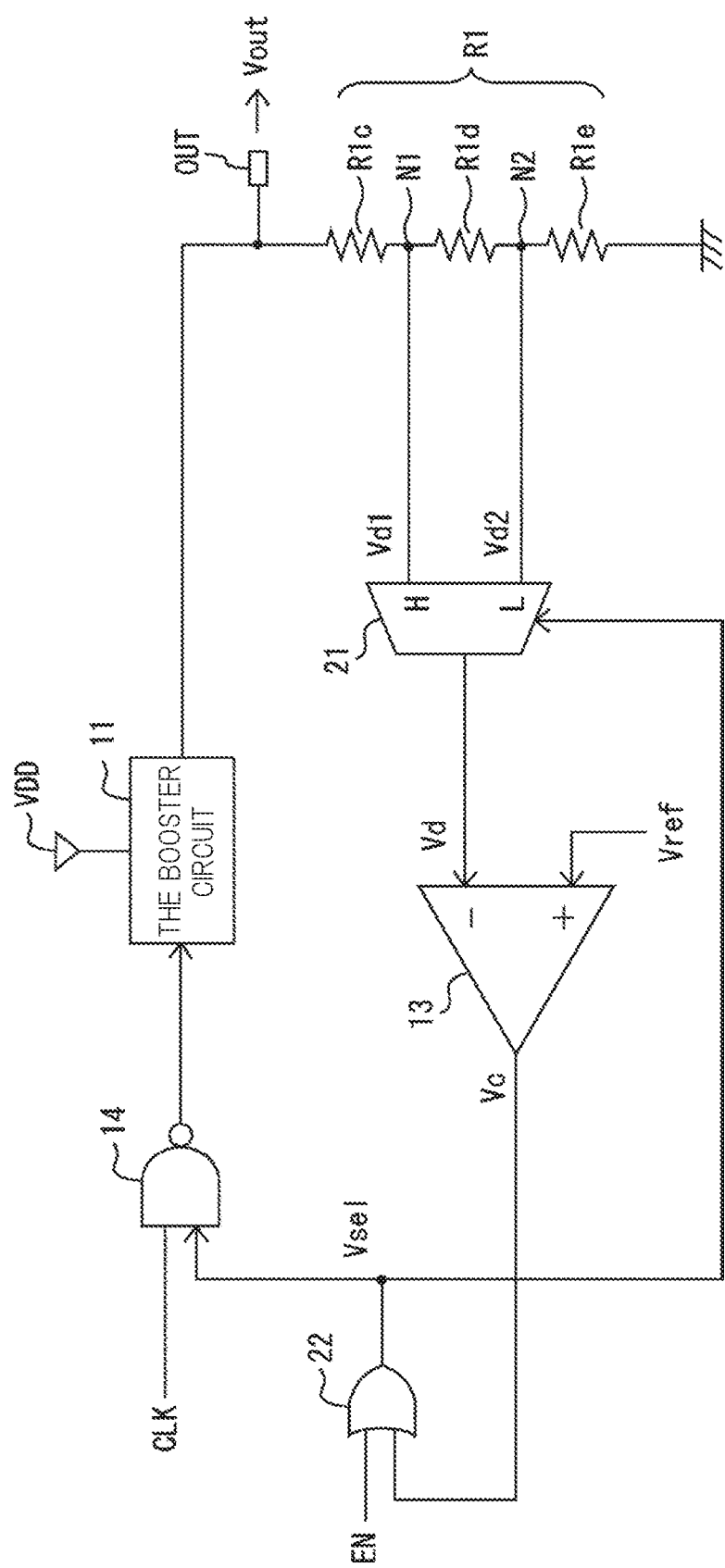
FIG. 9 is a diagram illustrating a modification of a power supply circuit according to the second embodiment.

FIG. 9 (a modification of power supply circuit 2) is a diagram showing a modification of power supply circuit 2 as a power supply circuit 2a. The power supply circuit 2 a further includes an OR circuit 22 as compared with the power supply circuit 2. The OR circuit 22 is a so-called enable circuit, and outputs a logical sum of the enable signal EN supplied from the outside and the voltage Vc outputted from the comparator 13 as a voltage Vsel. The enable signal EN may be shared with, for example, an enable signal used for controlling whether or not the booster circuit 11 or its peripheral circuits can operate.

The OR circuit 22 outputs a voltage Vsel at the H level regardless of the output voltage Vc of the comparator 13 when the enable signal EN is at the H level, and outputs the output voltage Vc of the comparator 13 as a voltage Vsel when the enable signal EN is at the L level. This voltage Vsel is inputted to the selector 21 and the NAND circuit 14 instead of the voltage Vc.

For example, the enable signal EN is set to the H level for a predetermined period immediately after the power supply is started. As a result, even when the output voltage Vc of the comparator 13 is unstable, the levels of the voltage Vsel input to the selector 21 and the NAND circuit 14 can be stabilized. When the output voltage Vc of the comparator 13 is stabilized after a predetermined period of time has elapsed, the enable signal EN is switched from the H level to the L level.

Accordingly, the output voltage Vc of the stable comparator 13 can be input to the selector 21 and the NAND circuit 14 as a voltage Vsel.

The OR circuit 22 can be appropriately changed to another circuit capable of outputting either the output voltage Vc of the comparator 13 or the fixed voltage as the voltage Vsel based on the enable signal EN.

Third Embodiment

Figure 10:
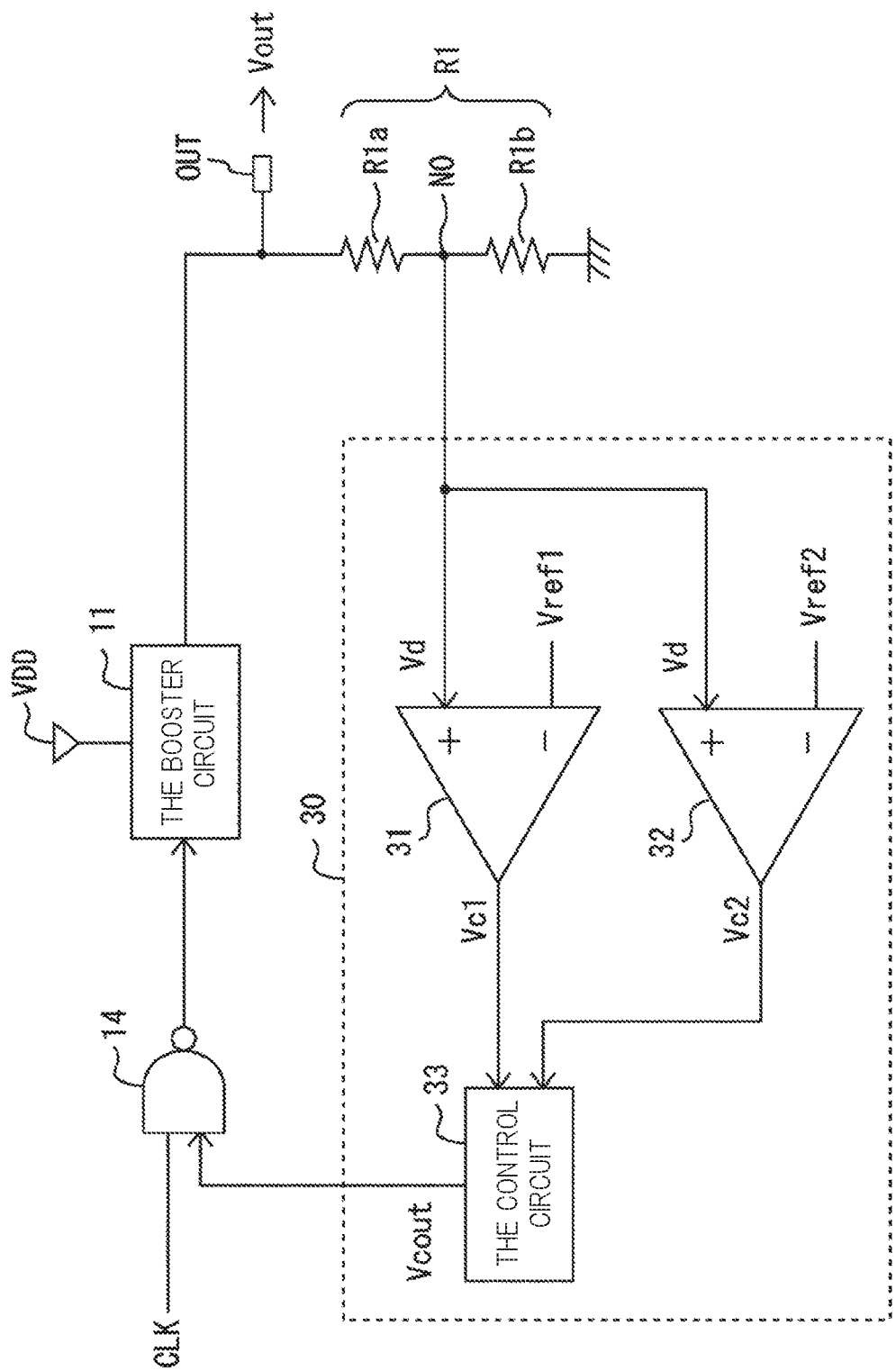
FIG. 10 is a diagram illustrating a configuration example of a power supply circuit according to a third embodiment.

FIG. 10 is a diagram showing a configuration example of the power supply circuit 3 according to the third embodiment. Compared with the power supply circuit 1, the power supply circuit 3 includes a comparison unit 30 instead of the comparison unit 10. The comparator 30 includes a comparator 31, a comparator 32, and a control circuit 33.

The comparator 31 compares the divided voltage Vd with the reference voltage Vref1, and outputs a voltage Vc1 as a result of the comparison. Ideally, the comparator 31 outputs the H-level voltage Vc1 when the divided voltage Vd is equal to or higher than the reference voltage Vref1, and outputs the L-level voltage Vc1 when the divided voltage Vd is less than the reference voltage Vref1.

The comparator 32 compares the divided voltage Vd with the reference voltage Vref2, and outputs a voltage Vc2 as a result of the comparison. Ideally, the comparator 32 outputs the H-level voltage Vc2 when the divided voltage Vd is equal to or higher than the reference voltage Vref2, and outputs the L-level voltage Vc2 when the divided voltage Vd is less than the reference voltage Vref2.

The control circuit 33 outputs a voltage Vcout corresponding to the voltages Vc 1 and Vc 2 outputted from the comparators 31 and 32, respectively.

Figure 11:
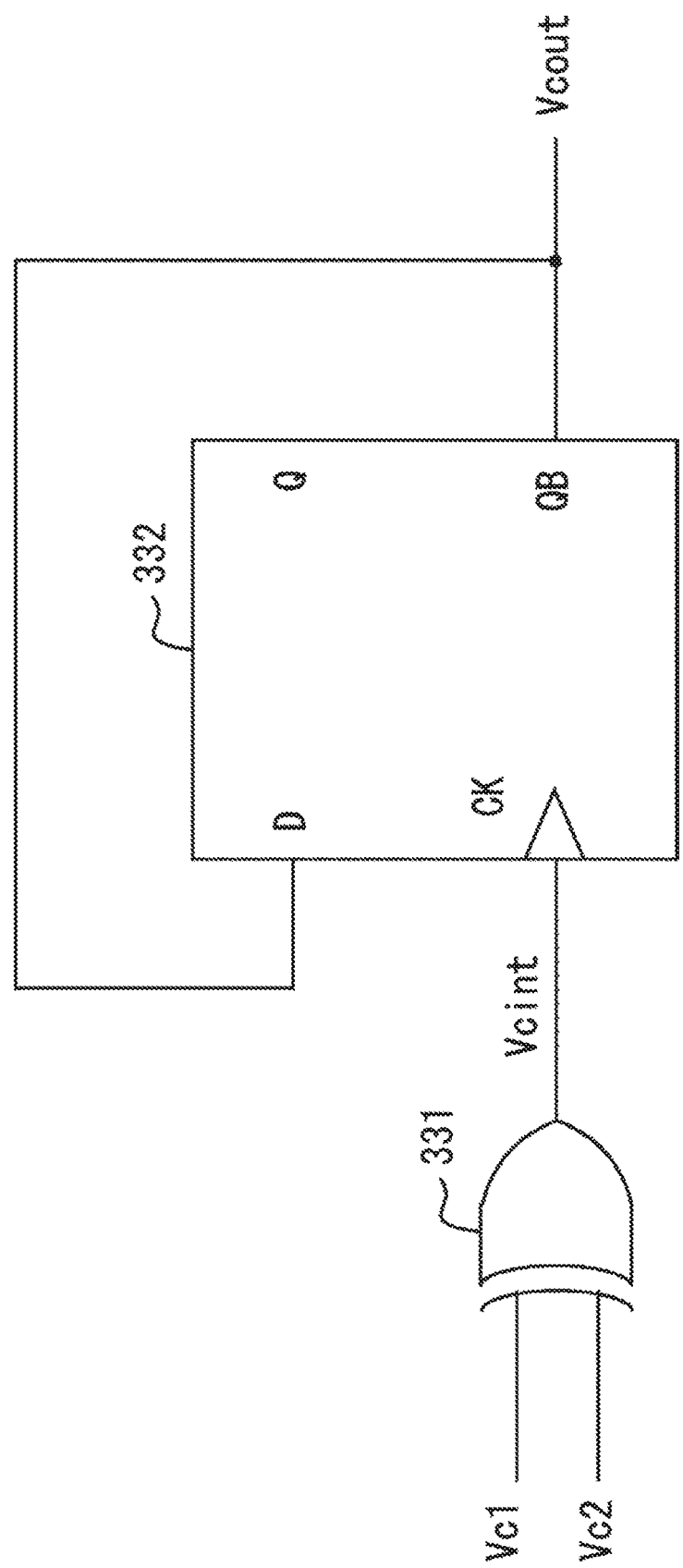
FIG. 11 is a diagram showing a specific configuration example of a control circuit provided in the power supply circuit shown in FIG. 10.

FIG. 11 is a diagram showing a specific configuration example of the control circuit 33. As shown in FIG. 11, the control circuit 33 includes an XOR circuit 331 and a D flip-flop 332. The XOR circuit 331 outputs the exclusive OR of the voltages Vc 1 and Vc 2 as a voltage Vcint. The D flip-flop 332 takes in the voltage Vout in synchronization with the rise of the voltage Vcint, logically inverts it, and outputs it as the voltage Vout.

The configuration of the control circuit 33 is not limited to the configuration shown in FIG. 11, and can be appropriately changed to another configuration capable of realizing the same function as the configuration shown in FIG. 11.

Returning to FIG. 10, the description will be continued. The NAND circuit 14 controls whether to output the clock signal CLK to the booster circuit 11 based on the output voltage Vcout of the control circuit 33. For example, when an L-level signal is output from the control circuit 33, the NAND circuit 14 outputs an H-level signal regardless of the clock signal CLK. That is, the NAND circuit 14 stops supplying the clock signal CLK to the booster circuit 11. On the other hand, when the H-level signal is outputted from the comparator 13, the NAND circuit 14 supplies the clock signal CLK (strictly speaking, an inverted signal of the clock signal CLK in this embodiment) to the booster circuit 11. In this case, the booster 11 boosts the output Vout.

The rest of the configuration of the power supply circuit 3 is the same as that of the power supply circuit 1, and a description thereof will be omitted.

Figure 12:
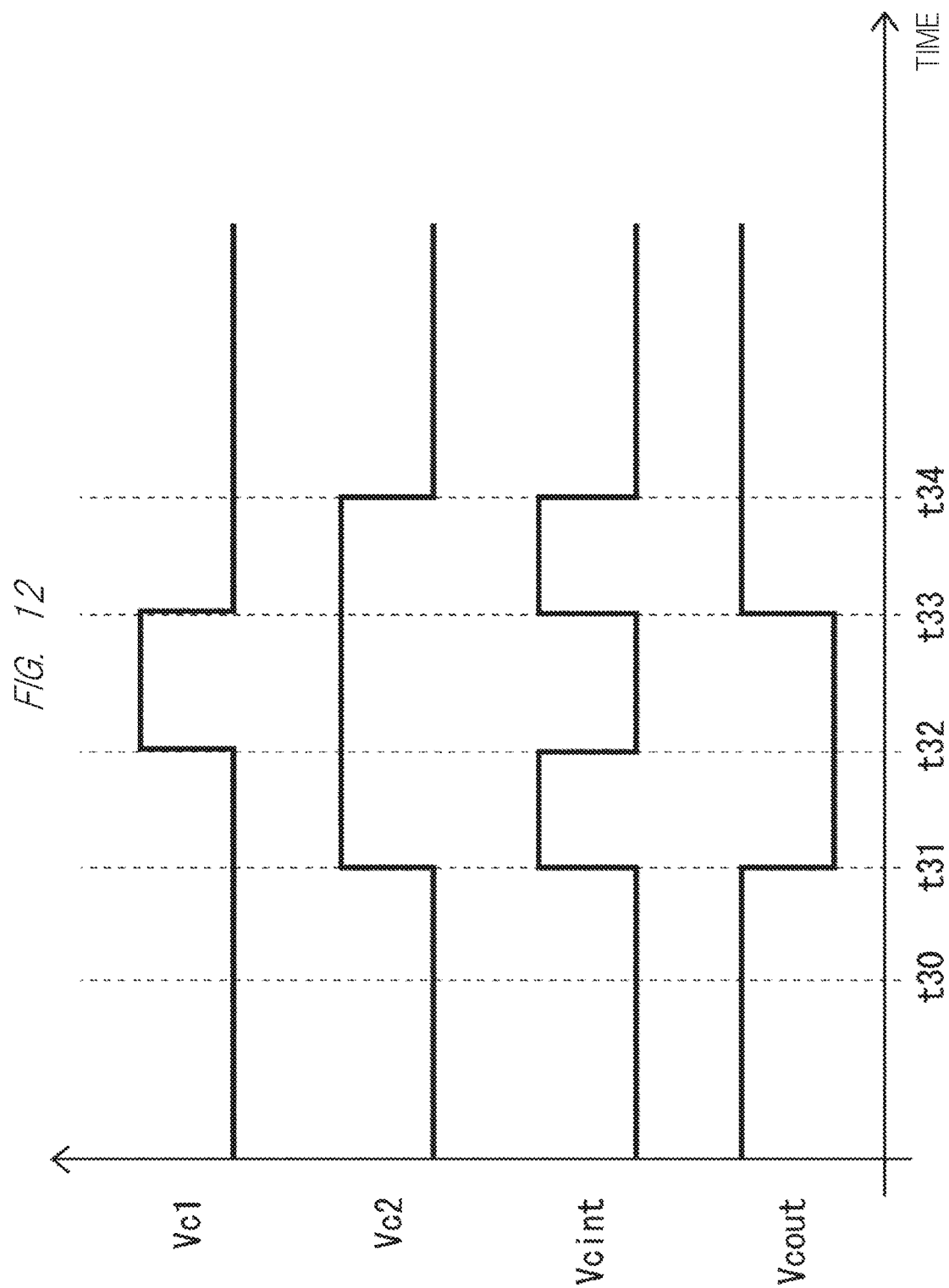
FIG. 12 is a timing chart illustrating the operation of the control circuit shown in FIG. 11.

Next, the operation of the power supply circuit 3 will be described with reference to FIG. 12. FIG. 12 is a timing chart showing the operation of the power supply circuit 3. In the following explanation, it is assumed that the power supply voltage VDD for driving the booster circuit 11 is 2V, the target voltage of the output voltage Vout of the booster circuit 11 is 10 V, the resistance ratio R1a:R1b of the resistance elements R1a and R1b is 9:1, the reference voltage Vref1 is 1.05 V, and the reference voltage Vref2 is 0.95V.

As shown in FIG. 12, immediately after the boosting of the output voltage Vout by the booster 11 is started, the output voltage Vout is less than the target voltage (=10V) (time t30).

Therefore, both the comparators 31 and 32 output the L-level voltages Vc1 and Vc2. Furthermore, in the control circuit 33, since the XOR circuit 331 outputs the L-level voltage Vcint, the D flip-flop 332 outputs the H-level voltage Vcout, which is an default value.

Since the H-level voltage Vcout is outputted from the control circuit 33, the NAND circuit 14 supplies the clock signal CLK to the booster circuit 11. As a result, the booster 11 continues to boost the output voltage Vout.

Thereafter, when the output voltage Vout rises to exceed the target voltage, first, the output voltage Vc2 of the comparator 32 is switched from the L level to the H level (time t31), and thereafter, the output voltage Vc1 of the comparator 31 is switched from the L level to the H level (time t32). As a result, in the control circuit 33, the output voltage Vcint of the XOR circuit 331 is switched from the L level to the H level (time t31), and thereafter, the output voltage is switched from the H level to the L level (time t32). Moreover, the D flip-flop 332 inverts the output voltage Vout from the H level to the L level in synchronization with the rise of the output voltage Vcint of the XOR-circuit 331 at time t 31.

Since the L-level voltage Vcout is outputted from the control circuit 33, the NAND circuit 14 stops supplying the clock signal CLK to the booster circuit 11. As a result, the booster circuit 11 stops boosting the output voltage Vout. As a result, the output voltage Vout starts to drop.

Thereafter, when the output voltage Vout drops below the target voltage, first, the output voltage Vc1 of the comparator 31 is switched from the H level to the L level (time t33), and thereafter, the output voltage Vc2 of the comparator 32 is switched from the H level to the L level (time t34). As a result, in the control circuit 33, the output voltage Vcint of the XOR circuit 331 is switched from the L level to the H level (time t33), and thereafter, the output voltage is switched from the H level to the L level (time t 34). The D flip-flop 332 inverts the output voltage Vout from the L level to the H level in synchronization with the rise of the output voltage Vcint of the XOR-circuit 331 at time t 34.

Thereafter, the operations from time t 31 to t 34 are repeated. As described above, the power supply circuit 3 according to the present embodiment controls whether or not the output voltage Vout is boosted by the booster circuit 11 based on the result of comparing the divided voltage Vd of the output voltage Vout and the reference voltage Vref1, Vref2. As a result, the power supply circuit 3 according to the present embodiment can partially overlap the ripple rising component and the ripple falling component of the booster circuit 11, so that the overall ripple component of the booster circuit 11 can be suppressed. In other words, the power supply circuit 1 according to the present embodiment can generate a stable output voltage Vout regardless of the magnitude of the output current to the loads.

Figure 13:
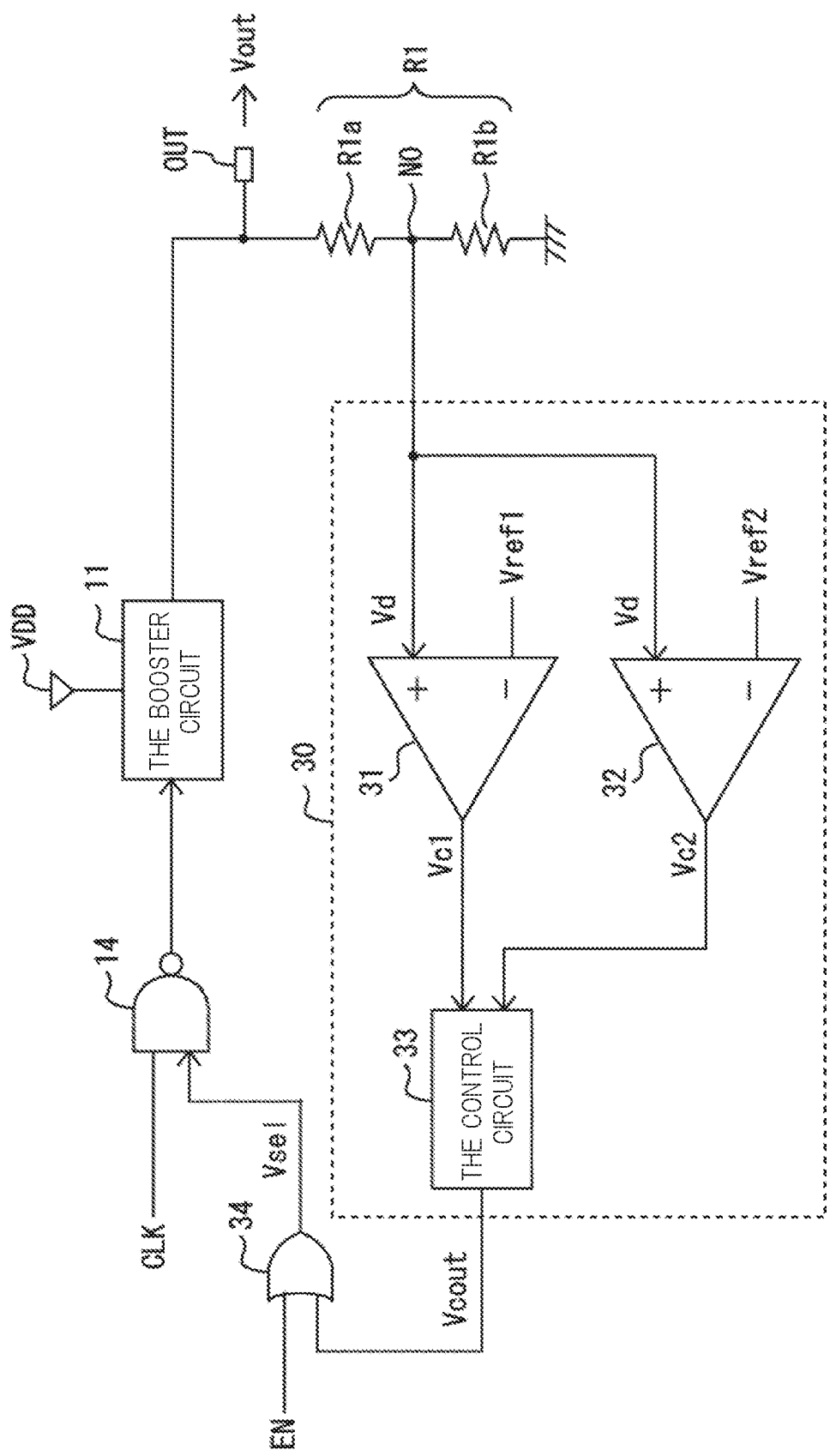
FIG. 13 is a diagram illustrating a modification of a power supply circuit according to the second embodiment.

FIG. 13 is a diagram showing a modification of the power supply circuit 3 as a power supply circuit 3a. The power supply circuit 3a further includes an OR circuit 34 as compared with the power supply circuit 3.

The OR circuit 34 is a so-called enable circuit, and outputs a logical sum of the enable signal EN supplied from the outside and the voltage Vcout outputted from the control circuit 33 as a voltage Vsel. The enable signal EN may be shared with, for example, an enable signal used for controlling whether or not the booster circuit 11 or its peripheral circuits can operate.

When the enable signal EN is H-level, the OR circuit 34 outputs an H-level voltage Vsel regardless of the output voltage Vcout of the control circuit 33, and when the enable signal EN is L-level, the output voltage Vcout of the control circuit 33 is outputted as a voltage Vsel. This voltage Vsel is inputted to the NAND circuits 14 instead of the voltage Vcout.

For example, the enable signal EN is set to the H level for a predetermined period immediately after the power supply is started. Thus, even when the output voltage Vcout of the control circuit 33 is unstable, the level of the voltage Vsel input to the NAND circuit 14 can be stabilized. When the output voltage Vcout of the control circuit 33 is stabilized after a predetermined period elapses, the enable signal EN is switched from the H level to the L level. As a result, the stable output voltage Vcout of the control circuit 33 can be input to the NAND circuit 14 as the output voltage Vsel.

The OR circuit 34 can be appropriately replaced to another circuit capable of outputting either the output voltage Vcout or the fixed voltage of the control circuit 33 as the voltage Vsel based on the enable signal EN.

Although the invention made by the inventor has been specifically described based on the embodiments, the present invention is not limited to the embodiments already described, and it is needless to say that various modifications can be made without departing from the gist thereof.

In Embodiments 1 to 3 described above, the reference voltage Vref1,Vref2 is fixed or the divided voltages Vd1 and Vd2 are fixed, but the present invention is not limited thereto. The power supply circuits 1 to 3 according to the first to third embodiments may include, for example, a measurement circuit for measuring ripple components (fluctuation range) of the output voltage Vout, and an adjustment circuit for adjusting the values of the reference voltage Vref1,Vref2 or the divided voltages Vd1 and Vd2 based on the measurement result of the measurement circuit. As a result, the ripple components of the output voltage Vout can be further suppressed.

For example, the power supply circuit according to the above embodiment may have a configuration in which a conductivity type (p-type or n-type) such as a semiconductor substrate, a semiconductor layer, or a diffusion layer (diffusion region) is inverted. Therefore, in the case where one of the conductivity types of the n-type and the p-type is the first conductivity type and the other conductivity type is the second conductivity type, the first conductivity type can be the p-type and the second conductivity type can be the n-type, or on the contrary, the first conductivity type can be the n-type and the second conductivity type can be the p-type.

What is claimed is:

1. A power supply circuit comprising:
   a comparing circuit comprising 1) a comparator configured to compare a divided voltage corresponding to an external output voltage with each of a first reference voltage and a second reference voltage and outputting a comparison result and 2) a selector configured to select one of the first reference voltage and the second reference voltage based on the comparison result from the comparator and outputting the selected reference;
   a first enabling circuit configured to control enabling output of a clock signal based on a comparison result by the comparing circuit;
   a second enabling circuit configured to control enabling output of a signal according to comparison result by the comparator to the selector and to the first enabling circuit based on an enable signal; and
   a booster circuit configured to boost the external output voltage when the clock signal is supplied through the first enable circuit.

2. The power supply circuit according to claim 1, wherein the selector switches selection from the second reference voltage to the first reference voltage higher than the second reference voltage, and outputs the selected reference voltage when a comparison result indicating that the divided voltage is equal to or greater than the selected reference voltage is output from the comparator, and
   wherein the selector switches selection from the first reference voltage to the second reference voltage, and outputs the selected reference voltage when a comparison result indicating that the divided voltage is less than the selected reference voltage is output from the comparator.

3. The power supply circuit according to claim 1, wherein the comparing circuit selects the first reference voltage or the second reference voltage based on the comparison result.

4. A power supply circuit comprising:
   a comparing circuit configured to compare a divided voltage corresponding to an external output voltage with each of a first reference voltage and a second reference voltage and output a comparison result;
   a first enabling circuit configured to control enabling to output a clock signal based on a comparison result by the comparing circuit; and
   a booster circuit configured to boost the external output voltage when the clock signal is supplied through the first enable circuit,
   wherein the comparing circuit comprises:
      a first comparator that compares the divided voltage with the first reference voltage;
      a second comparator that compares the divided voltage with the second reference voltage; and
      a control circuit that outputs a voltage corresponding to a comparison results of each of the first comparator and the second comparator as a comparison result by the comparing circuit.

5. The power supply circuit according to claim 4, wherein the control circuit includes:
   an exclusive OR circuit that outputs an exclusive OR of a comparison result by the first comparator and a comparison result by the second comparator; and
   a flip-flop circuit that inverts an output voltage of the control circuit in synchronization with a rise of an output voltage of the exclusive OR circuit.

6. A power supply circuit comprising:
   a comparator configured to compare a divided voltage selected from a first divided voltage and a second divided voltage corresponding to an external output voltage with a reference voltage;
   a selector configured to select one of the first divided voltage and the second divided voltage based on a comparison result by the comparator and outputting the selected divided voltage as the divided voltage;
   a first enabling circuit configured to control enabling output of a clock signal based on a comparison result by the comparator;
   a second enabling circuit configured to control enabling output of the comparison result by the comparator to the first enabling circuit based on an enable signal; and
   a booster circuit configured to boost the external output voltage when the clock signal is supplied through the first enable circuit.

7. The power supply circuit according to claim 6, wherein, when a comparison result indicating that the selected divided voltage is equal to or higher than the reference voltage is output from the comparator, the selection is switched from the first divided voltage to the second divided voltage lower than the first divided voltage and output as the selected divided voltage, and when a comparison result indicating that the selected divided voltage is lower than the reference voltage is output from the comparator, the selection is switched from the second divided voltage to the first divided voltage and output as the selected divided voltage.

* * * * *